(12) United States Patent
Kobayashi

(10) Patent No.: US 7,875,140 B2
(45) Date of Patent: Jan. 25, 2011

(54) METHOD FOR MANUFACTURING MULTILAYER CERAMIC SUBSTRATE

(75) Inventor: Toshiyuki Kobayashi, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/260,432

(22) Filed: Oct. 29, 2008

(65) Prior Publication Data

US 2009/0126856 A1   May 21, 2009

(30) Foreign Application Priority Data

Nov. 20, 2007 (JP) ............................. 2007-300850
Nov. 29, 2007 (JP) ............................. 2007-309283
Jul. 10, 2008 (JP) ............................. 2008-180371

(51) Int. Cl.
*C03B 29/00* (2006.01)
*B32B 37/00* (2006.01)
*B32B 7/12* (2006.01)

(52) U.S. Cl. ............... 156/89.11; 156/89.12; 156/309.9; 156/327

(58) Field of Classification Search ............... 156/89.11, 156/89.12, 309.9, 322
See application file for complete search history.

(56) References Cited

U.S. PATENT DOCUMENTS

| | | | | |
|---|---|---|---|---|
| 2002/0058731 A1* | 5/2002 | Breton et al. | ................ | 523/160 |
| 2003/0016484 A1* | 1/2003 | Iwaida et al. | ............. | 361/306.3 |
| 2004/0101996 A1* | 5/2004 | Hyoto et al. | ................ | 438/128 |
| 2004/0226733 A1* | 11/2004 | Anthony et al. | ........... | 174/35 R |
| 2005/0263846 A1* | 12/2005 | Inoue et al. | ................ | 257/531 |
| 2006/0158826 A1* | 7/2006 | Tokuoka et al. | ............. | 361/311 |
| 2008/0113098 A1* | 5/2008 | Toyoda et al. | ............... | 427/256 |

FOREIGN PATENT DOCUMENTS

| | | | |
|---|---|---|---|
| JP | 05-315184 | | 11/1993 |
| JP | 05315184 A | * | 11/1993 |
| JP | 06-077658 | | 3/1994 |
| JP | 09260844 A | * | 10/1997 |
| JP | 10095677 A | * | 4/1998 |
| JP | 2005057140 A | * | 6/2003 |
| JP | 2005-057139 | | 3/2005 |
| JP | 2007-201245 | | 8/2007 |

* cited by examiner

*Primary Examiner*—Philip C Tucker
*Assistant Examiner*—Alex Efta
(74) *Attorney, Agent, or Firm*—Harness, Dickey & Pierce, P.L.C.

(57) ABSTRACT

A method for manufacturing a multilayer ceramic substrate includes: a) discharging a droplet of a conductive ink on each of a plurality of green sheets so as to draw a liquid pattern made of the conductive ink on each of the green sheets; b) drying the liquid pattern so as to form a dry pattern; c) laminating the green sheets including the dry pattern so as to form a laminated body, and applying hydrostatic pressure on the laminated body that is decompress-packaged so as to form a pressure-bonded body; and d) firing the pressure-bonded body so as to form a multilayer ceramic substrate. In the method, in the step a), the liquid pattern is drawn by drawing a wiring liquid pattern and a dummy liquid pattern drawn along a vicinity of the wiring liquid pattern.

8 Claims, 12 Drawing Sheets

METHOD FOR MANUFACTURING MULTILAYER CERAMIC SUBSTRATE

BACKGROUND

1. Technical Field

The present invention relates to a method for manufacturing a multilayer ceramic substrate.

2. Related Art

Low temperature co-fired ceramics technique enables a collective firing of a green sheet and metal, realizing an element mounting substrate in which various types of passive elements are built-in between ceramic layers. In terms of a mounting technique of system on package (SOP), a manufacturing method relating to the element mounting substrate (hereinafter, referred to as merely a multilayer LTCC substrate) has been devotedly developed in order to compound electronic components and minimize parasitic effect occurring at surface mounting components.

In the method for manufacturing a multilayer LTCC substrate, a drawing step, a pressure-bonding step, and a firing step are sequentially conducted. In the drawing step, patterns of passive elements and wirings are drawn on each of a plurality of green sheets. In the pressure-bonding step, the plurality of green sheets having the patterns are laminated to be pressure-bonded. In the firing step, a pressure-bonded body obtained through the pressure-bonding step is fired at a time.

For the drawing step, JP-A-2005-57139, as a first example, discloses an ink-jet method in which a conductive ink is discharged as fine droplets so as to densify various patterns. According to the ink-jet method, patterns are drawn with droplets of several picoliters or several dozen picoliters. Therefore, changing of discharging positions of the droplets can realize miniaturization of patterns or pitch narrowing.

For the pressure-bonding step, JP-A-5-315184, JP-A-6-77658, and JP-A-2007-201245, as a second to fourth examples, disclose a hydrostatic pressure method by which hydrostatic pressure is applied to a laminated body in order to stabilize a laminating state of green sheets. The hydrostatic pressure method decompress-packages the laminated body and then leaves it in a heated liquid so as to increase static pressure of the liquid. Accordingly, pressure can be uniformly applied to the laminated body.

FIGS. 14A to 17B show a shape of a pattern in the drawing step and the pressure-bonding step described above. FIG. 14A is a plan view illustrating a shape of a pattern in the drawing step, and FIG. 14B is a sectional view taken along the line 14-14 of FIG. 14A. FIG. 15A is a plan view illustrating a shape of the pattern, which is shown in FIGS. 14A and 14B, in the pressure-bonding step, and FIG. 15B is a sectional view taken along the line 15-16 of FIG. 15A.

FIG. 16A is a plan view illustrating a shape of a pattern with another pattern that is laminated, in the drawing step, and FIG. 16B is a sectional view taken along the line 16-16 of FIG. 16A. FIG. 17A is a plan view illustrating a shape of the pattern, which is shown in FIGS. 16A and 16B, in the pressure-bonding step, and FIG. 17B is a sectional view taken along the line 17-17 of FIG. 17A.

A conductive ink used in the ink-jet method in the drawing step is a dispersal system of conductive fine particles of which a particle diameter is commonly several nanometers to several dozen nanometers. As shown in FIGS. 14A to 16B, a pattern 101 formed through the drawing step is an aggregate of conductive fine particles 102, so that even if a solvent or a dispersion medium is evaporated, the pattern 101 keeps to have high fluidity until it is fired in the firing step.

In the pressure-bonding step, as shown in FIGS. 15A and 15B, for example, green sheets 103 sandwiching the pattern 101 are pressure-bonded by atmospheric pressure. At this time, the conductive fine particles 102 before fired are easily squashed by the atmospheric pressure in the decompress-packaging because the conductive fine particles 102 have weak adherence with respect to the green sheets 103 and weak binding power with each other. As a result, the pattern 101 deforms to extend along a main face 103a of the green sheets 103, overflowing from a desired pattern region 104 (two dot chain line in FIGS. 14A to 15B). Therefore, patterns 101 that are adjacent each other are electrically connected disadvantageously.

Further, as shown in FIGS. 16A and 16B, if the green sheets 103 are laminated so as to form a laminated body, a portion of patterns 101 (the conductive fine particles 102) of the green sheet 103 positioned upper and a portion of patterns 101 of the green sheet 103 positioned lower are overlapped with each other in a laminating direction. The portions, which are overlapped with each other, of the patterns 101 of the green sheets 103 in the laminated body are largely affected by pressing force when the laminated body is pressed from up and down direction, compared to other portions of the patterns 101. Therefore, as shown in FIGS. 17A and 17B, the portions, which are overlapped in a laminating direction, of the patterns 101 largely deform compared to the portions, which are not overlapped in the laminating direction, of the patterns 101, overflowing from a desired pattern region 104 (shown by two dot chain line in FIGS. 16A to 17B). As a result, the patterns 101 overlapped with each other in the laminating direction disadvantageously further progresses the electrical connection, described above, between the patterns 101.

SUMMARY

An advantage of the present invention is to provide a method for manufacturing a multilayer ceramic substrate in which processing accuracy of a pattern formed with droplets is improved and a multilayer ceramic substrate manufactured by the method.

A method for manufacturing a multilayer ceramic substrate according to a first aspect of the invention includes: a) discharging a droplet of a conductive ink on each of a plurality of green sheets so as to draw a liquid pattern made of the conductive ink on each of the green sheets; b) drying the liquid pattern so as to form a dry pattern; c) laminating the green sheets including the dry pattern so as to form a laminated body, and applying hydrostatic pressure on the laminated body that is decompress-packaged so as to form a pressure-bonded body; and d) firing the pressure-bonded body so as to form the multilayer ceramic substrate. In the method, the liquid pattern is drawn by drawing a wiring liquid pattern and a dummy liquid pattern drawn along a vicinity of the wiring liquid pattern, in the step a).

According to the method of the first aspect, the dummy liquid pattern is drawn near the wiring liquid pattern. The wiring liquid pattern and the dummy liquid pattern are respectively processed to be a wiring dry pattern and a dummy dry pattern, in the step b). The wiring dry pattern and the dummy dry pattern mutually disperse pressing force received from the green sheets positioned upside and downside thereof, in the step c). In the green sheets that are laminated, for example, even in a region where a wiring dry pattern of a first green sheet is overlapped with a wiring dry pattern of a second green sheet, the dummy pattern can disperse the pressing force caused by the wiring dry pattern of the second green sheet in the laminating direction. Accordingly, deformation of the wiring dry pattern and the dummy dry pattern caused by the pressure of the green sheets can be reduced so as to improve processing accuracy of a pattern to be formed on the multilayer ceramic substrate.

In the method for manufacturing a multilayer ceramic substrate, it is preferable that, the green sheets that are laminated include a first green sheet and a second green sheet, and in a case where a wiring liquid pattern drawn on the first green sheet is overlapped with a wiring liquid pattern of the second green sheet in a laminating direction, a dummy liquid pattern be drawn near a region where the wiring liquid patterns are overlapped with each other, in the step a).

According to the method of the aspect, in a case where a wiring liquid pattern of the first green sheet is overlapped with a wiring liquid pattern of the second green sheet in the laminating direction, a dummy liquid pattern is drawn near the overlapping region. Therefore, when the pressure-bonded body is formed, the wiring dry pattern of the first green sheet can disperse the pressing force received from the dry pattern of the second green sheet to the dummy dry pattern. As a result, in each of the green sheets, in a region where the wiring dry pattern easily deforms, deformation of the wiring dry pattern can be reduced, being able to improve processing accuracy of a pattern to be formed on the multilayer ceramic substrate.

A method for manufacturing a multilayer ceramic substrate according to a second aspect of the invention includes: a) discharging a droplet of a conductive ink on each of a plurality of green sheets so as to draw a liquid pattern made of the conductive ink on each of the green sheets; b) drying the liquid pattern so as to form a dry pattern; c) laminating the green sheets including the dry pattern so as to form a laminated body, and applying hydrostatic pressure on the laminated body that is decompress-packaged so as to form a pressure-bonded body; and d) firing the pressure-bonded body so as to form a multilayer ceramic substrate. In the method, in the step a), the green sheets that are laminated include a first green sheet and a second green sheet, and in a case where a wiring liquid pattern drawn on the first green sheet is overlapped with a wiring liquid pattern of the second green sheet in a laminating direction, a dummy liquid pattern is drawn near a region where the wiring liquid patterns are overlapped with each other.

According to the method of the second aspect, in the wiring liquid pattern of the green sheets, in a case where a wiring liquid pattern of the first green sheet is overlapped with a wiring liquid pattern of the second green sheet in the laminating direction, a dummy liquid pattern is drawn near the overlapping region. Therefore, in the green sheets, in a region where the liquid pattern drawn on the first green sheet and the liquid pattern drawn on the second green sheet are overlapped with each other, a wiring dry pattern obtained by drying the wiring liquid pattern and a dummy dry pattern obtained by drying the dummy liquid pattern are formed. Therefore, when the pressure-bonded body is formed, the wiring dry pattern of the first green sheet can disperse the pressing force received from the dry pattern of the second green sheet to the dummy dry pattern. As a result, in each of the green sheets, in a region where the wiring dry pattern easily deforms, deformation of the wiring dry pattern can be reduced, being able to improve processing accuracy of a pattern to be formed on the multilayer ceramic substrate.

In the method of the aspect, it is preferable that the wiring liquid pattern and the dummy liquid pattern be drawn to have a distance less or equal to a predetermined distance therebetween, in the step a).

According to the method of the aspect, the wiring liquid pattern and the dummy liquid pattern are drawn so as to have a distance less or equal to a predetermined distance therebetween. The distance between the wiring dry pattern and the dummy dry pattern formed in the step b) is less or equal to the predetermined distance, disposing the patterns in high density. Therefore, the pressing force received from the green sheets positioned upside and downside of the patterns is further preferably dispersed to the patterns, whereby the patterns can be supported. As a result, the deformation of the wiring dry pattern and the dummy dry pattern caused by the pressure of the green sheets can be further reduced.

In the method of the aspect, it is preferable that the dummy liquid pattern be drawn at both sides of the wiring liquid pattern, in the step a).

According to the method of the aspect, the dummy liquid patterns are drawn at the both sides of the wiring liquid pattern, so that the dummy dry patterns are formed at the both sides of the wiring dry pattern. The wiring dry pattern and the dummy dry patterns positioned at the both sides of the wiring dry pattern can mutually disperse the pressing force received from the green sheets so as to be supported. As a result, the deformation of the wiring dry pattern disposed between the dummy dry patterns can be especially reduced.

In the method of the aspect, it is preferable that, in the step b), the wiring liquid pattern be dried so as to form a wiring dry pattern and the dummy liquid pattern be dried so as to form a dummy dry pattern, and the wiring dry pattern and the dummy dry pattern be free from contact with each other in a case where hydrostatic pressure is applied to the laminated body in the step c).

According to the method of the aspect, even if hydrostatic pressure is applied to the laminated body, the wiring dry pattern and the dummy dry pattern do not contact with each other, being able to provide no electrical effect caused by the contact of the dummy dry pattern with the wiring dry pattern.

In the method of the aspect, it is preferable that each of the green sheets be heated so as to draw the dummy liquid pattern, in the step a).

According to the method of the aspect, each of the green sheets is heated so as to draw the dummy liquid pattern. Therefore, the dummy liquid pattern increases its viscosity due to the drying so as to suppress its expansion. As a result, accuracy in the distance between the wiring liquid pattern and the dummy liquid pattern can be further improved.

BRIEF DESCRIPTION OF THE DRAWINGS

The invention will be described with reference to the accompanying drawings, wherein like numbers reference like elements.

FIG. 9A shows a liquid pattern drawn on one green sheet, and FIG. 9B shows a liquid pattern drawn on another green sheet.

FIG. 10A shows a dry pattern formed on one green sheet, and FIG. 10B shows a dry pattern formed on another green sheet.

FIG. 12A is a plan view showing a case where two green sheets are laminated, and FIG. 12B is a sectional view taken along the line 12-12 of FIG. 12A.

DESCRIPTION OF EXEMPLARY EMBODIMENTS

First Embodiment

Figure 1:
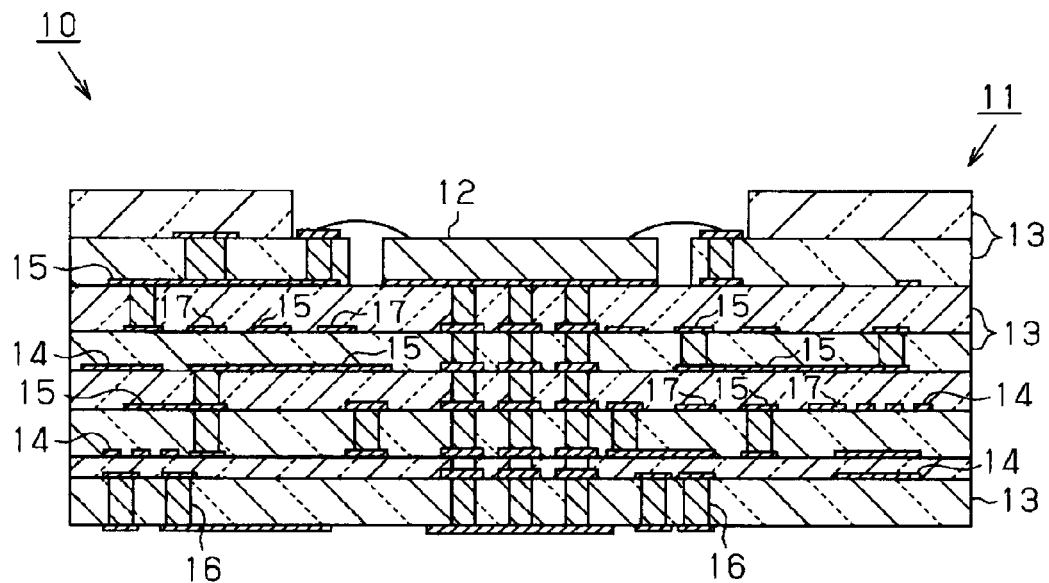
FIG. 1 is a sectional view showing a circuit module.

A first embodiment of the invention will be described below with reference to FIGS. 1 to 8. FIG. 1 is a sectional view showing a circuit module including a multilayer ceramic substrate manufactured by a manufacturing method of the embodiment of the invention.

Referring to FIG. 1, this circuit module 10 includes a multilayer low temperature co-fired ceramics (LTCC) substrate 11 serving as a multilayer ceramic substrate and a semiconductor chip 12 coupled to the multilayer LTCC substrate 11.

The multilayer LTCC substrate 11 includes a plurality of LTCC substrates 13 that are laminated. Each of the LTCC substrates 13 is a sintered body of a green sheet and has a thickness of several dozen micrometers to several hundred micrometers. Between the LTCC substrates 13, various internal elements 14 such as a resistance element, a capacitance element, and a coil element, and internal wirings 15 electrically connecting to the internal elements 14 are built-in. In each of the LTCC substrates 13, via wirings 16 having a stack-via structure or a thermal-via structure are formed. At the both sides of the internal wirings 15 that are required to have a highly-accurate wiring width among the internal wirings 15, dummy lines 17 are disposed at a predetermined distance from the internal wirings 15. The internal elements 14, the internal wirings 15, the via wirings 16, and the dummy lines 17 are sintered bodies of conductive fine particles, and are formed by the ink-jet method using a conductive ink. Here, in the present embodiment, the dummy lines 17 are made of the same material as that of the internal wirings 15, but the dummy lines 17 are formed so as to improve processing accuracy of the internal wirings 15 and are not used as wirings.

Figure 2:
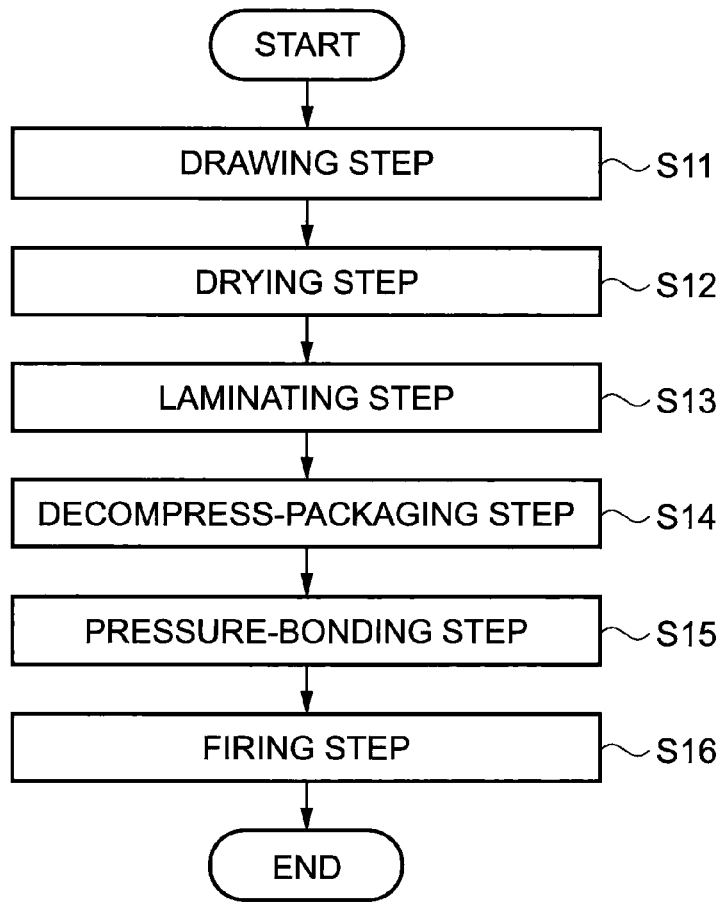
FIG. 2 is a flowchart showing a method for manufacturing a multilayer ceramic substrate.

A method for manufacturing the multilayer LTCC substrate 11 will now be described with reference to FIGS. 2 to 8. FIG. 2 is a flowchart showing the method for manufacturing the multilayer LTCC substrate 11, and FIGS. 3 to 8 are process drawings showing the method for manufacturing the multilayer LTCC substrate 11.

Referring to FIG. 2, in the method for manufacturing the multilayer LTCC substrate 11, a drawing step (step S11) and a drying step (step S12) are sequentially conducted. In the drawing step, a liquid pattern is drawn on a green sheet that is a precursor of the LTCC substrate 13. In the drying step, the liquid pattern is dried. Further, in the method for manufacturing the multilayer LTCC substrate 11, a laminating step (step S13), a decompress-packaging step (step S14), a pressure-bonding step (step S15), and a firing step (step S16) are sequentially conducted. In the laminating step, a plurality of green sheets are laminated so as to form a laminated body. In the decompress-packaging step, the laminated body is decompress-packaged. In the pressure-bonding step, the laminated body is pressure-bonded so as to form a pressure-bonded body. In the firing step, the pressure-bonded body is fired.

<Drawing Step>

Figure 3:
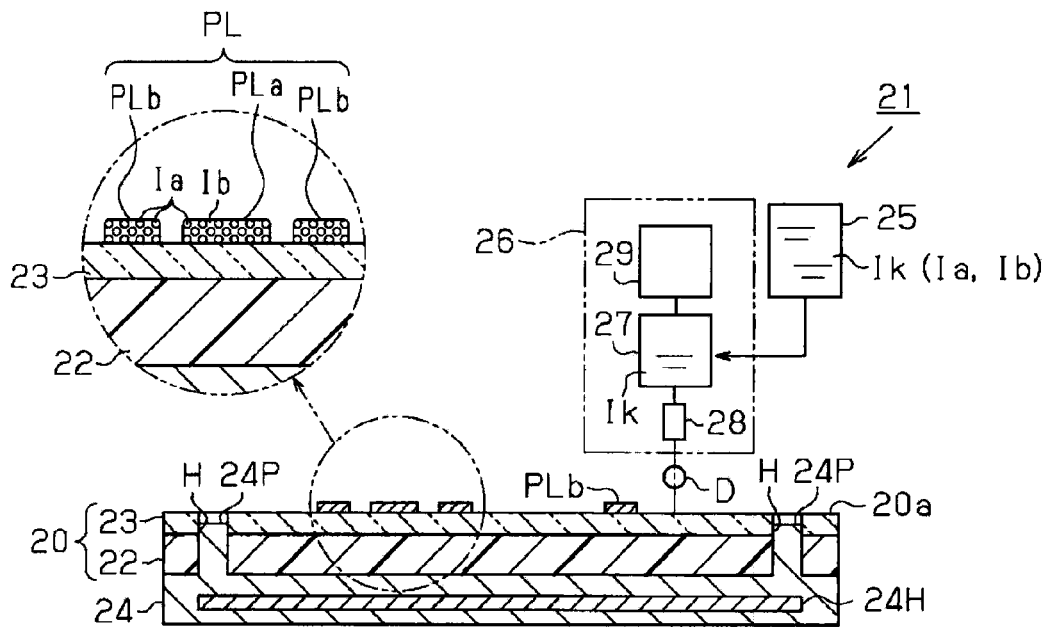
FIG. 3 is a process drawing showing the method for manufacturing a multilayer ceramic substrate.

Referring to FIG. 3, the drawing step uses a laminated sheet 20 and a droplet discharge device 21. The laminated sheet 20 includes a carrier film 22 and a green sheet 23 that is applied to the carrier film 22.

The carrier film 22 supports the green sheet 23 in the drawing step and the drying step, and can be a plastic film having, for example, a peeling property with respect to the green sheet 23 and an excellent mechanical resistance in each of the steps. The carrier film 22 may be a polyethylene terephthalate film, a polyethylene naphthalate film, a polyethylene film, and a polypropylene film.

The green sheet 23 is a layer made of glass ceramic composition containing glass ceramic powder, binder, and the like. The green sheet 23 is formed to have a thickness of several dozen micrometers in a case where a capacitor element is formed as the internal element 14, and a thickness of 100 μm to 200 μm in other cases. The green sheet 23 is formed by a sheet forming method such as a doctor blade method or a reverse roll coater method. The green sheet 23 is obtained by applying a glass ceramic composition that is slurried by a dispersion medium on the carrier film 22 and drying the applied film until the film becomes to be able to be handled. The dispersion medium can be a surfactant or a silane coupling agent, for example. Any dispersion medium can be used as long as it evenly disperses glass ceramic powder.

The glass ceramic power has an average particle diameter of 0.1 μm to 5 μm, and can be glass composite ceramic in which borosilicate glass is mixed with ceramic powder such as alumina, forsterite, or the like. The glass ceramic powder can be made of crystallized glass ceramic containing $ZnO$—$MgO$—$Al_2O_3$—$SiO_2$ crystallized glass or non-vitreous ceramic containing $BaO$—$Al_2O_3$—$SiO_2$ ceramic powder or $Al_2O_3$—$CaO$—$SiO_2$—$MgO$—$B_2O_3$ ceramic powder.

The binder functions as a binding material of the glass ceramic powder, and is an organic polymer that is decomposed in the firing step so as to be easily removed. The binder may be made of binder resin such as butyral resin, acrylic resin, and cellulose resin. The acrylic binder resin can be homopolymer of (meth)acrylate compound such as alkyl (meth)acrylate, alkoxyalkyl(meth)acrylate, polyalkylene glycol (meth)acrylate, and cycloalkyl(meth)acrylate. Further, the acrylic binder resin can be copolymer including two or more types of the (meth)acrylate compounds or copolymer including (meth)acrylate compound and other copolymerizable monomer of unsaturated carbonic acids, for example. The binder may contain plasticizer such as adipate ester plasticizer, dioctylphthalate (DOP), dibutylphthalate (DBP), phthalate ester plasticizer, and glycol ester plasticizer.

At edges of the laminated sheet 20, circular holes (hereinafter, referred to as merely positioning holes H) having a predetermined pore diameter are formed by punching processing. To each of the positioning holes H, a positioning pin 24P positioning a placing plate 24 is inserted. Thus each position of a drawing face 20a is positioned with respect to the droplet discharge device 21.

To the green sheet 23, a circular hole which is not shown or circular conic hole which is not shown (hereinafter, referred to as merely a via hole) having a pore diameter of several dozen micrometers to several hundred micrometers is formed by the punching processing or laser processing so as to penetrate the green sheet. The via hole is filled with a conductive material such as silver, gold, copper, and palladium in a previous step by a squeegee method using a conductive paste or an ink-jet method using a conductive ink.

The droplet discharge device 21 includes a placing plate 24 for placing the laminated sheet 20; an ink tank 25 for storing a conductive ink Ik; and a droplet discharge head 26 discharging the conductive ink Ik stored in the ink tank 25 to the drawing face 20a.

The placing plate 24 is a plate member made of a rigid material and having an approximately same size as the laminated sheet 20, and includes the positioning pin 24P for positioning the laminated sheet 20 and a heater 24H for heating the laminated sheet 20. When the laminated sheet 20 is placed on the placing plate 24, the positioning pin 24P is inserted into the positioning hole H so as to position each position of the drawing face 20a with respect to the droplet discharge head 26. Further, when the laminated sheet 20 is placed on the placing plate 24, the placing plate 24 drives the heater 24H so as to heat the laminated sheet 20 up to a drawing temperature that is at least higher than room temperature (20 degrees Celsius).

The conductive ink Ik is a dispersion system in which conductive fine particles Ia are dispersed in a dispersion medium Ib, and the viscosity thereof is adjusted to be 20 cP or less so as to enable fine droplets D to be discharged.

The conductive fine particles Ia have a particle diameter of several nanometers to several dozen nanometers and can be made of a metal such as gold, silver, copper, platinum, palladium, rhodium, osmium, ruthenium, iridium, iron, tin, cobalt, nickel, chromium, titanium, tantalum, tungsten, and indium, or their alloys. Any dispersion medium Ib can be used as long as it can evenly disperse the conductive fine particles Ia. The dispersion medium Ib can be water, an aqueous system primarily containing water, or an organic system primarily containing an organic solvent such as tetradecane.

The droplet discharge head 26 includes a cavity 27 communicating with the ink tank 25; a nozzle 28 communicating with the cavity 27; and a pressure generating element 29 coupled to the cavity 27. The cavity 27 receives the conductive ink Ik from the ink tank 25 so as to supply the nozzle 28 with the conductive ink Ik. The nozzle 28 has an opening of several dozen micrometers and stores the conductive ink Ik from the ink tank 25.

The pressure generating element 29 is a piezoelectric element or a capacitance element changing a bulk of the cavity 27 or a resistance heating element changing a temperature of the cavity 27, and generates predetermined pressure inside the cavity 27. When the pressure generating element 29 is driven, an air-liquid interface (meniscus) is vibrated and thus the nozzle 28 discharges the conductive ink Ik as droplets D of several picoliters to several dozen picoliters.

In the drawing step, the laminated sheet 20 and the droplet discharge head 26 are relatively moved in a planar direction of the drawing face 20a, and a plurality of droplets D discharged from the nozzle 28 land on the drawing face 20a so as to coalesce on the drawing face 20a. Thus a liquid pattern PL continuing in a predetermined direction is formed on the drawing face 20a. At this time, the temperature of the laminated sheet 20 is at a drawing temperature, so that the liquid pattern PL increases its viscosity due to evaporation of a part of the dispersion medium Ib, being able to suppressing extension thereof along the drawing face 20a.

Figure 4:
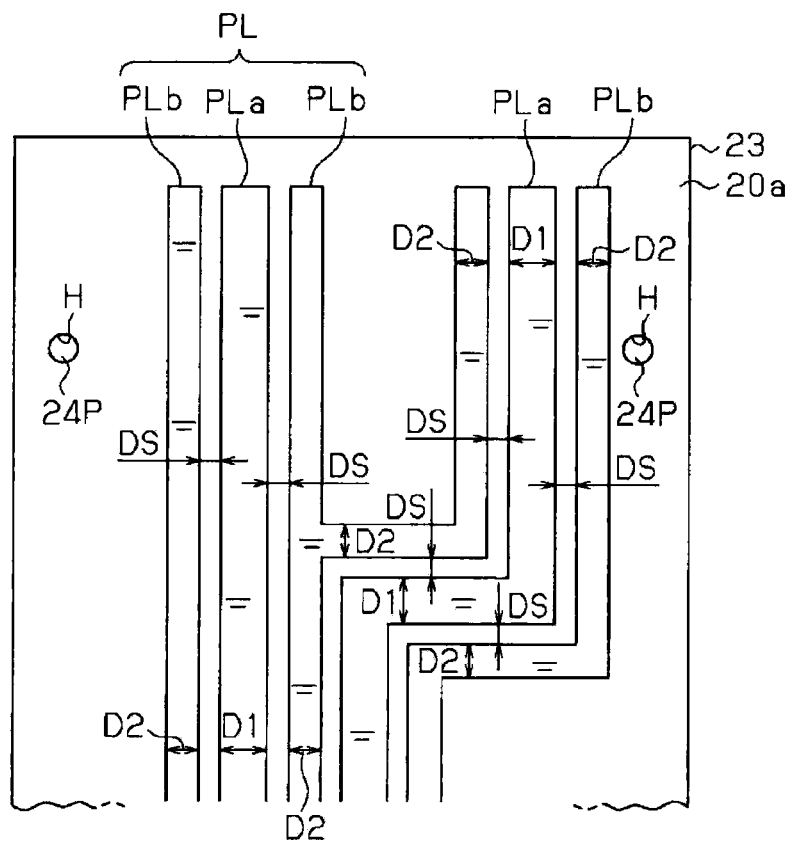
FIG. 4 is a plan view showing a liquid pattern in the method for manufacturing a multilayer ceramic substrate according to a first embodiment.

FIG. 4 shows the liquid pattern PL drawn on the drawing face 20a. The liquid pattern PL drawn on the drawing face 20a is composed of a wiring liquid pattern PLa and dummy liquid patterns PLb drawn on the both sides of the wiring liquid pattern PLa.

The wiring liquid pattern PLa is a pattern for forming the internal wiring 15 on the LTCC substrate 13, and has a width for forming the internal wiring 15 having a desired width (hereinafter, referred to as merely a pattern width D1). The width is calculated in an experiment in advance.

Each of the dummy liquid patterns PLb is formed in approximately parallel to the wiring liquid pattern PLa to which each of the dummy liquid patterns PLb corresponds. The dummy liquid pattern PLb is a pattern for forming the dummy line 17 that is not used as wiring on the LTCC substrate 13, and has a width for forming the dummy lines 17 having a desired width (hereinafter, referred to as merely a pattern width D2). The width is calculated in an experiment in advance.

The wiring liquid pattern PLa and the dummy liquid pattern PLb that corresponds to the wiring liquid pattern PLa are apart from each other at a predetermined distance by which the internal wiring 15 and the dummy line 17 are not allowed to electrically contact with each other (hereinafter, referred to as merely a width DS). The distance is calculated in an experiment in advance.

<Drying Step>

Figure 5:
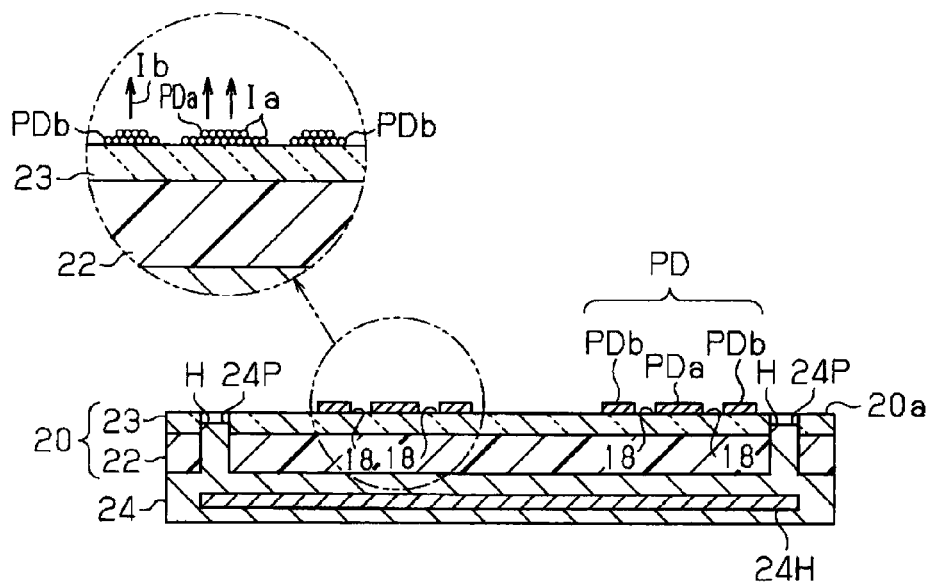
FIG. 5 is a process drawing showing the method for manufacturing a multilayer ceramic substrate according to the first embodiment.

Referring to FIG. 5, in the drying step, the laminated sheet 20 after undergoing the drawing step is brought into a drying device such as a drying furnace so as to be heated up to a drying temperature that is at least higher than room temperature (20 degrees Celsius) in a manner having the liquid pattern PL. Since the laminated sheet 20 is in the drying temperature, the liquid pattern PL further progresses its drying. Accordingly, almost all the dispersion medium Ib in the liquid pattern PL is evaporated, forming a dry pattern PD composed of an aggregate of the conductive fine particles Ia on the drawing face 20a.

Figure 6:
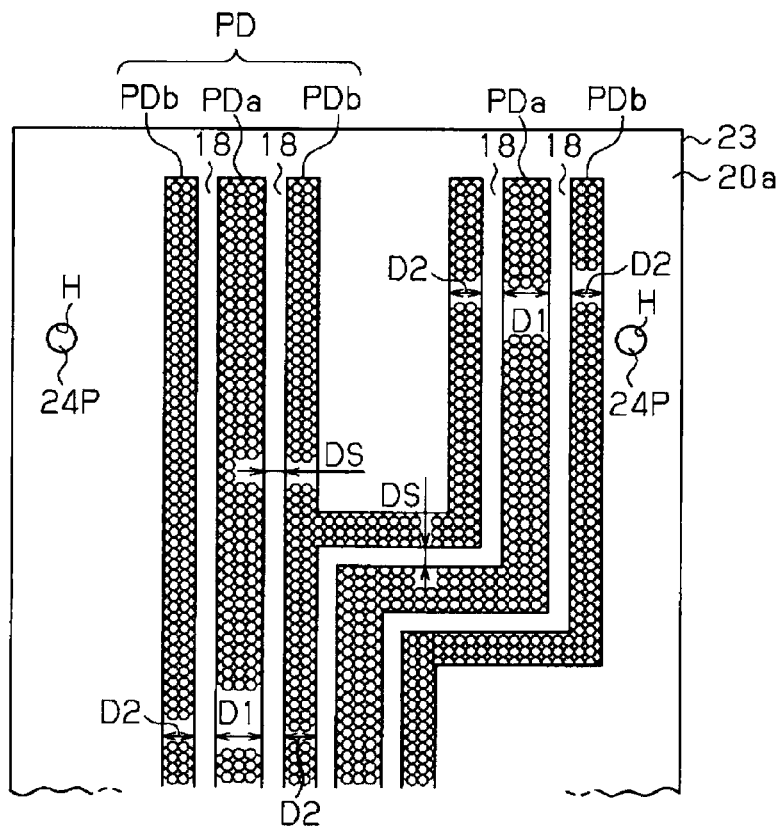
FIG. 6 is a plan view showing a dry pattern in the method for manufacturing a multilayer ceramic substrate according to the first embodiment.

Referring to FIG. 6, in the drying step, the wiring liquid pattern PLa is dried so as to form a wiring dry pattern PDa, and the dummy liquid pattern PLb is dried so as to form a dummy dry pattern PDb. That is, a plurality of wiring dry patterns PDa and a plurality of dummy dry patterns PDb are formed on the drawing face 20a. Between the wiring dry pattern PDa and the dummy dry patterns PDb that are formed at the both sides of the wiring dry pattern PDa, grooves 18 having the width DS are formed.

<Laminating Step>

Figure 7:
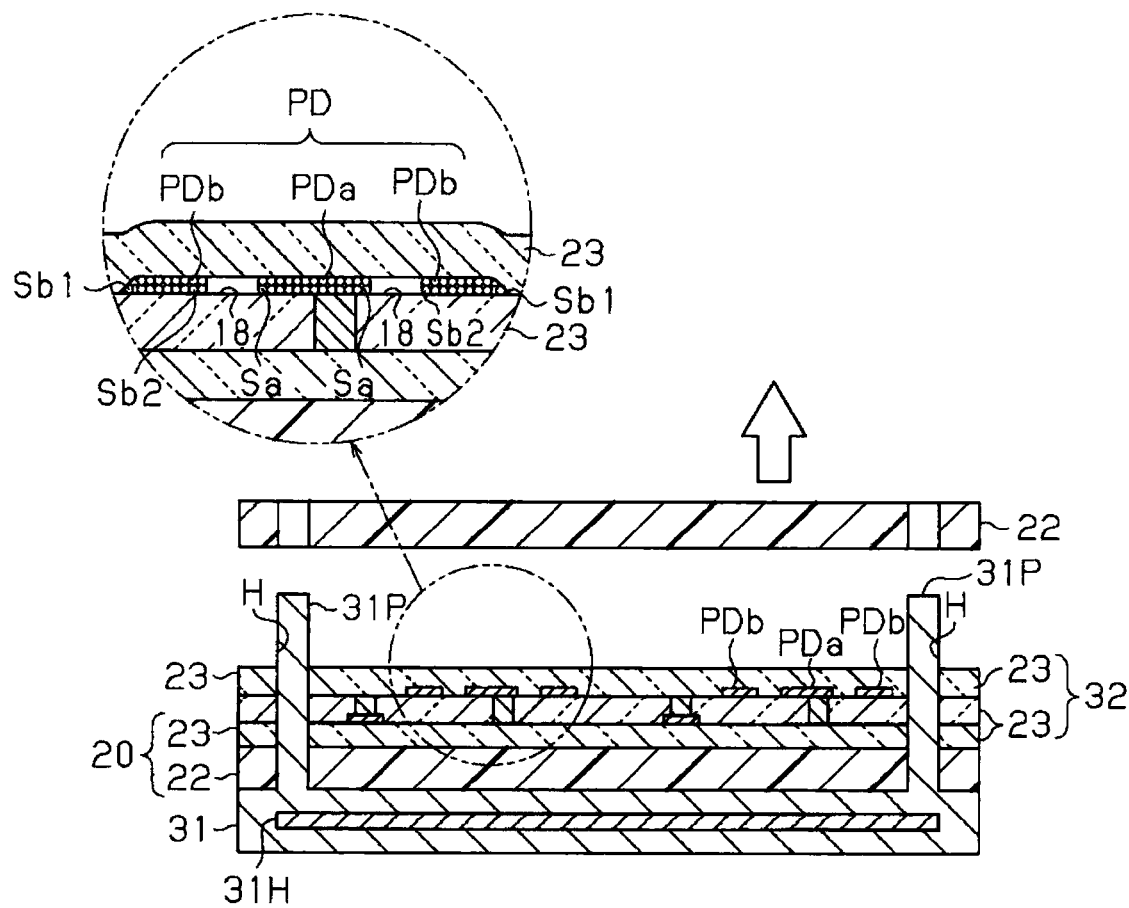
FIG. 7 is a process drawing showing the method for manufacturing a multilayer ceramic substrate according to the first embodiment.

Referring to FIG. 7, in the laminating step, a base plate 31 for laminating the plurality of green sheets 23 is used. The base plate 31 is a plate member made of a rigid material and having an approximately same size as the laminated sheet 20, and includes a positioning pin 31P for positioning the plurality of green sheets 23 and a heater 31H for heating the green sheets 23.

In the laminating step, a laminated sheet 20 that is a first layer is placed on the base plate 31 in a manner allowing the green sheet 23 to face upside. The positioning pin 31P is inserted into the positioning hole H so as to position the laminated sheet 20 that is the first layer on the base plate 31. Subsequently, a laminated sheet 20 that is a second layer is placed on the base plate 31 in a manner allowing its green sheet 23 to face downside. The positioning pin 31P is inserted into the positioning hole H so as to position the laminated sheet 20 that is the second layer, and a carrier film 22 is peeled off. Thus only the green sheet 23 of the second layer is laminated on the green sheet 23 of the first layer. Hereafter, a predetermined number of green sheets 23 are sequentially laminated in the same manner so as to form a laminated body of the green sheets 23 having the dry patterns PD (hereinafter, referred to as merely a laminated body 32). While the laminated body 32 is formed, the base plate 31 drives the heater 31H to heat each of the green sheets 23 up to a laminating temperature that is at least higher than room temperature (20 degrees Celsius).

When a green sheet 23 is laminated on another green sheet 23, each of dry patterns (wiring dry patterns PDa and dummy dry patterns PDb) between the layers is pressed by the green sheets 23 positioned in up and down direction. At this time, since the dummy dry patterns PDb are disposed at the both sides of the wiring dry pattern PDa, the wiring dry pattern PDa and the dummy dry patterns PDb can mutually disperse the pressing force from the green sheets 23 positioned in up and down direction. Therefore, the pressing force to the wiring dry pattern PDa is reduced compared to a case where the dummy dry patterns PDb are not provided, so that the wiring dry pattern PDa does not easily deform by the pressing force and further, the dummy dry patterns PDb do not easily deform by the force. Especially, disposing of the dummy dry patterns PDb on the both sides of the wiring dry pattern PDa can effectively decrease the degree of deformation of the wiring dry pattern PDa.

At an external lateral end Sb1 that is at an opposite side to the wiring dry pattern PDa across the dummy dry pattern PDb, the green sheet 23 bends because a dry pattern PD is not disposed near the external lateral end Sb1, deforming the external lateral end Sb1 due to stress caused by the bend of the green sheet 23. On the other hand, the dummy dry patterns PDb are disposed at the both sides of the wiring dry pattern PDa with the grooves 18 that are interposed between the patterns PDa and PDb and have the width DS, so that the green sheet 23 can be supported by the wiring dry pattern PDa and the dummy dry patterns PDb. Accordingly, the green sheet 23 does not easily deform at both lateral ends Sa of the wring dry pattern PDa and at an internal lateral ends Sb2, which are at a wiring dry pattern PDa side, of the dummy dry patterns PDb. Therefore, the lateral ends Sa and Sb2 do not easily receive the stress caused by the bend of the green sheet 23, being able to suppress their deformation. Here, since the green sheet 23 easily bends in a case where the width DS of the groove 18 is large, it is preferable that the groove 18 have less or equal to the maximum length (predetermined distance), based on an experiment and the like conducted in advance, so as not to allow the green sheet 23 to bend. Thus the deformation of the wiring dry pattern PDa and the dummy dry patterns PDb can be further suppressed.

Further, the wiring dry pattern PDa is apart from the dummy dry patterns PDb at a distance of the width DS, so that even if they are slightly deformed by the pressing force, they do not electrically contact with each other.

<Decompress-Packaging Step>

Figure 8:
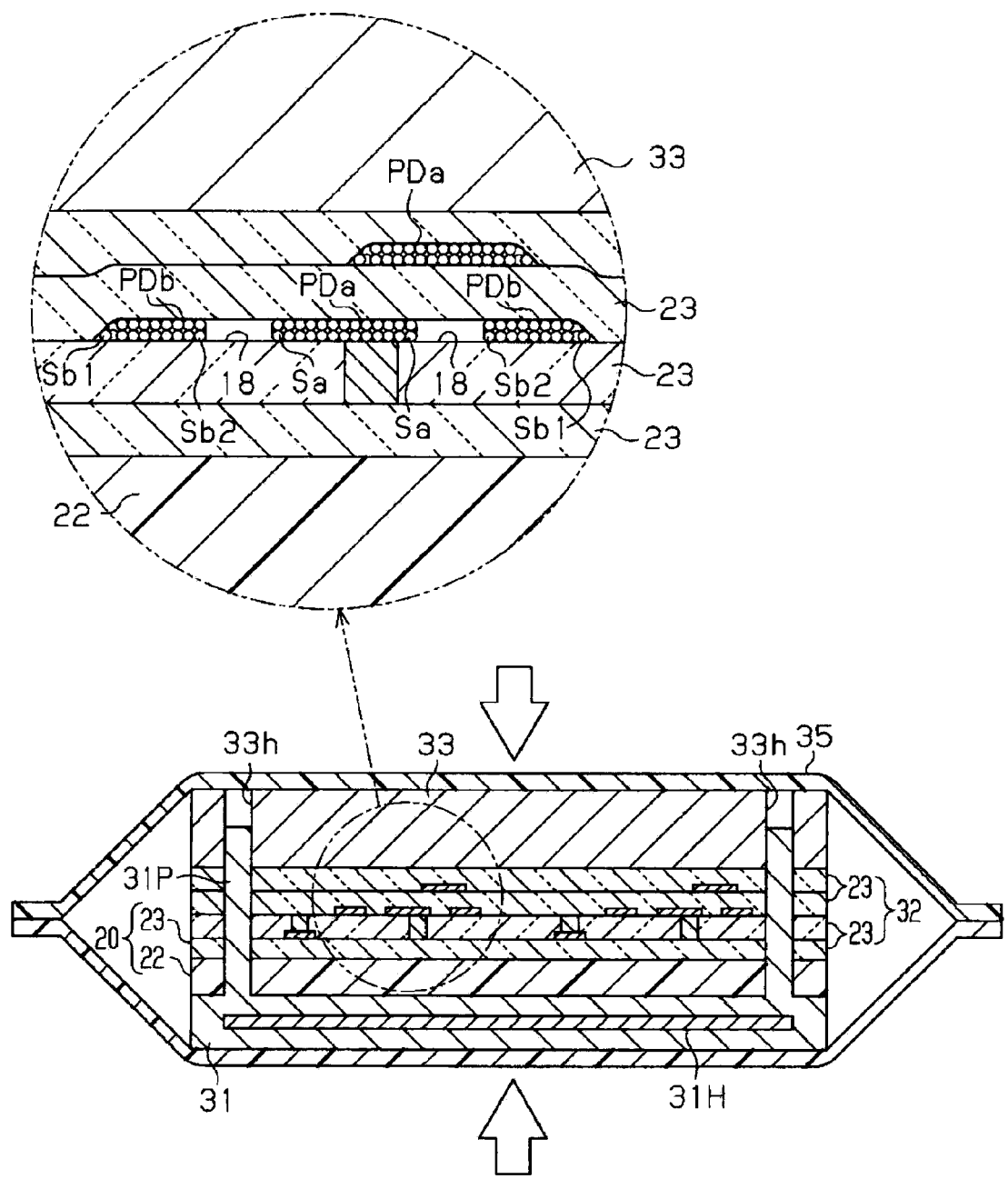
FIG. 8 is a process drawing showing the method for manufacturing a multilayer ceramic substrate according to the first embodiment.

Referring to FIG. 8, the decompress-packaging step uses a cover plate 33 and a vacuum packaging bag 35. The cover plate 33 is a plate member made of a rigid material and having an approximately same size as the base plate 31, and includes a plurality of insert holes 33h to which the positioning pin 31P can be inserted. The vacuum packaging bag 35 has bendability by which the base plate 31, the cover plate 33, and the laminated body 32 can be sealed therein.

In the decompress-packaging step, the positioning pin 31P is inserted into the insert hole 33h of the cover plate 33 and thus the laminated body 32 is sandwiched by the base plate 31 and the cover plate 33. The base plate 31 and the cover plate 33 are housed in the vacuum packaging bag 35 in a manner sandwiching the laminated body 32 and are vacuum-sealed in the vacuum packaging bag 35 by suction with a sealer or the like. The laminated body 32 that is vacuum-sealed receives atmospheric pressure through the vacuum packaging bag 35, the base plate 31, and the cover plate 33 so as to be pressed and bonded.

At this time, even though each of the dry patterns PD (wiring dry patterns PDa and dummy dry patterns PDb) are pressed by the green sheets 23 positioned in up and down direction, the wiring dry patterns PDa and the dummy dry patterns PDb disperse pressing force from the green sheets 23 positioned in the up and down direction thereof, being able to suppress the deformation thereof.

While the laminated body 32 is vacuum-sealed, the base plate 31 drives the heater 31H to heat each of the green sheets 23 up to a laminating temperature that is at least higher than room temperature (20 degrees Celsius).

<Pressure-Bonding Step>

In the pressure-bonding step, the laminated body 32 after undergoing the decompress-packaging is brought into a hydrostatic pressing device and hydrostatic pressure is applied to the laminated body 32 so as to form a pressure-bonded body. At this time, even though each of the dry patterns PD (wiring dry patterns PDa and dummy dry patterns PDb) is pressed by the green sheets 23 positioned in up and down direction, the wiring dry patterns PDa and the dummy dry patterns PDb disperse the pressing force from the green sheets 23 positioned in the up and down direction, being able to suppress the deformation thereof.

The laminated body 32 receives heat from the heater 31H or a warm water layer so as to be heated up to a pressure-bonding temperature that is at least higher than room temperature (20 degrees Celsius) while hydrostatic pressure is applied to the laminated body 32.

<Firing Step>

In the firing step, the pressure-bonded body obtained through the pressure-bonding step is taken out of the base plate 31 and brought into a predetermined firing furnace so as to be fired at a firing temperature.

In the firing step, the grooves 18 are filled with the green sheet 23 in a process in which hardness of the green sheet 23 and each of the dry patterns PD is relatively changed due to the temperature change, in a process in which the binder of the green sheet 23 is decomposed and removed, and the like. For example, if the green sheet 23 becomes soft relative to the each of the dry patterns PD, the green sheet 23 deforms so as to fill each of the grooves 18. Accordingly, no gap is formed at a position of each of the grooves 18 in the multilayer LTCC substrate 11.

The firing temperature is, for example, 800 degrees Celsius to 1000 degrees Celsius, and is adequately changed depending on a composition of the green sheet 23. In a case where the dry pattern PD is made of Cu, it is preferable that the pressure-bonded body be fired in a reduction atmosphere so as to prevent oxidation. In a case where the dry pattern PD is made of silver, gold, platinum, palladium, or the like, the pressure-bonded body may be fired in an ambient atmosphere. In the firing step, the pressure-bonded body may be fired in a manner being pressurized by smaller pressure than the hydrostatic pressure in the pressure-bonding step. Accordingly, the flatness of the multilayer LTCC substrate 11 is improved so as to prevent warpage or peeling of each of the green sheets 23.

Advantageous effects according to the embodiment configured as described above will be described below.

(1) According to the embodiment, the dummy liquid pattern PLb is drawn near the wiring liquid pattern PLa. Therefore, the wiring dry pattern PDa formed from the wiring liquid pattern PLa in the drying step and the dummy dry pattern PDb formed from the dummy liquid pattern PLb can mutually disperse the pressing force received from the green sheets 23 positioned at the upside and the downside of the patterns in the laminating step, the decompress-packaging step, and the pressure-bonding step. Accordingly, the deformation of the wiring dry pattern PDa and the dummy dry pattern PDb caused by the pressure of the green sheets 23 can be reduced so as to improve processing accuracy of a pattern to be formed on the LTCC substrate 13.

(2) According to the embodiment, the width DS between the wiring liquid pattern PLa and the dummy liquid pattern PLb is less or equal to the maximum length (predetermined distance) by which the green sheets 23 bend into the grooves 18. Thus, the wiring dry pattern PDa and the dummy dry pattern PDb are disposed at high density, so that they can more suitably disperse the pressing force received from the green sheets 23 positioned at the upside and the downside thereof. As a result, the deformation of the wiring dry pattern PDa and the dummy dry pattern PDb caused by the pressure of the green sheets 23 can be reduced.

(3) According to the embodiment, the dummy liquid patterns PLb are drawn at the both sides of the wiring liquid pattern PLa, so that the wiring dry pattern PDa can disperse the pressing force received from the green sheets 23 to the dummy dry patterns PDb positioned at the both sides thereof. Therefore, the deformation of the wiring dry pattern PDa can be especially reduced so as to further improve the processing accuracy of a pattern formed between layers.

(4) According to the embodiment, the wiring dry pattern PDa is apart from the dummy dry pattern PDb at a distance of the width DS, so that even though hydrostatic pressure is applied to the laminated body 32, the wiring dry pattern PDa and the dummy dry pattern PDb do not electrically contact with each other, providing no electrical disadvantage. As a result, even though the dummy dry pattern PDb is separately formed, electrical characteristics are not deteriorated in the circuit module 10.

(5) According to the embodiment, each of the green sheets 23 (drawing sheet 20) is heated up to the drawing temperature so as to draw the dummy liquid pattern PLb. Therefore, the dummy liquid pattern PLb increases its viscosity due to the drying so as to be able to suppress the extension thereof along the drawing face 20a. As a result, length accuracy of the distance (the width DS) between the wiring liquid pattern PLa and the dummy liquid pattern PLb can be improved.

Second Embodiment

A second embodiment of the invention will now be described with reference to FIGS. 9A to 13. In FIGS. 9A to 13, members same as those of the first embodiment will be given the same reference numerals and the description thereof will be omitted.

In the LTCC substrate 13 included in the multilayer LTCC substrate 11, dummy lines 17 are disposed near the both sides of a portion of internal wiring 15. The portion is overlapped with internal wiring 15 disposed on another layer in the laminating direction and is required to have a wiring width with high processing accuracy. The multilayer LTCC substrate 11 is manufactured through each of the manufacturing steps for manufacturing the multilayer LTCC substrate 11 as is the case with the first embodiment. Differences from the first embodiment will be primarily described below.

<Drawing Step>

Figure 9A:
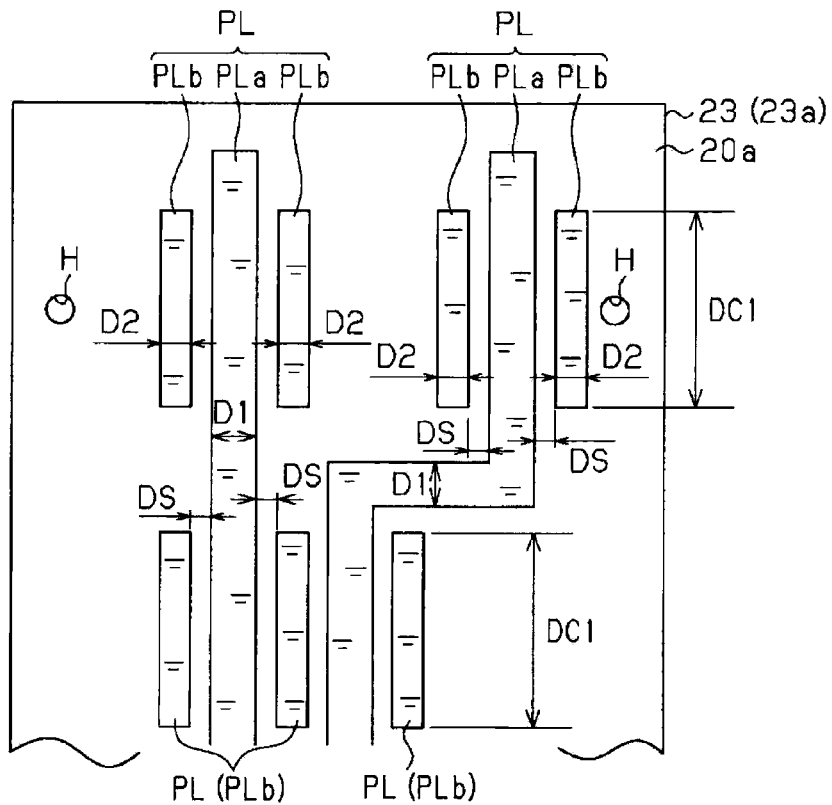
FIGS. 9A and 9B are plan views showing a liquid pattern in a method for manufacturing a multilayer ceramic substrate according to a second embodiment.
Figure 9B:
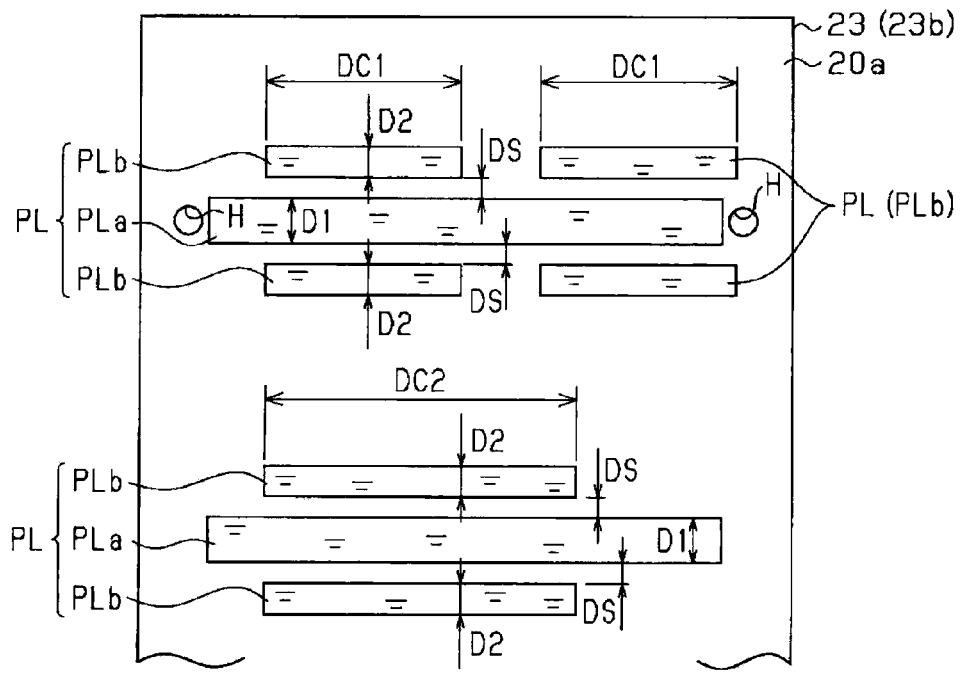

FIGS. 9A and 9B show two green sheets 23 on which liquid patterns PL are formed in the drawing step. Each of the green sheet 23 shown in FIG. 9A (hereinafter, referred to as merely a first sheet 23a) and the green sheet 23 shown in FIG. 9B (hereinafter, referred to as merely a second sheet 23b) is formed on an individual laminated sheet 20.

The liquid patterns PL are respectively drawn on the first sheet 23a and the second sheet 23b, and the liquid patterns PL are respectively composed of the wiring liquid pattern PLa and the dummy liquid patterns PLb drawn near the both sides of a predetermined portion of the wiring liquid pattern PLa.

The wiring liquid pattern PLa is drawn for forming the internal wiring 15 on the LTCC substrate 13 as is the case with the first embodiment, and has a width of a pattern width D1 that is calculated in an experiment in advance. The dummy liquid patterns PLb are for forming the dummy lines 17 that are not used as wirings on the LTCC substrate 13, and have a width of a pattern width D2 that is calculated in an experiment in advance. The wiring liquid pattern PLa is apart from the dummy liquid patterns PLb at a distance (width DS) by which the internal wiring 15 and the dummy lines 17 to be formed on the LTCC substrate 13 do not electrically contact with each other. The distance is calculated in an experiment in advance.

The dummy liquid patterns PLb are disposed to have a predetermined length in approximately parallel to the wiring liquid pattern PLa to which the dummy liquid patterns PLb correspond. The dummy liquid patterns PLb are disposed near a portion (overlapping region) of the wiring liquid pattern PLa of one layer. The portion of the wiring liquid pattern PLa of one layer overlaps with internal wirings 15 and the like formed on another layer in up and down direction. The length of the dummy liquid pattern PLb (hereinafter, referred to as merely a dummy pattern length DC1 or a dummy pattern length DC2) is set so as to improve the processing accuracy of the internal wirings 15 and form the internal wirings 15 having a desired width on the LTCC substrate 13. The length is calculated in an experiment in advance.

<Drying Step>

Figure 10A:
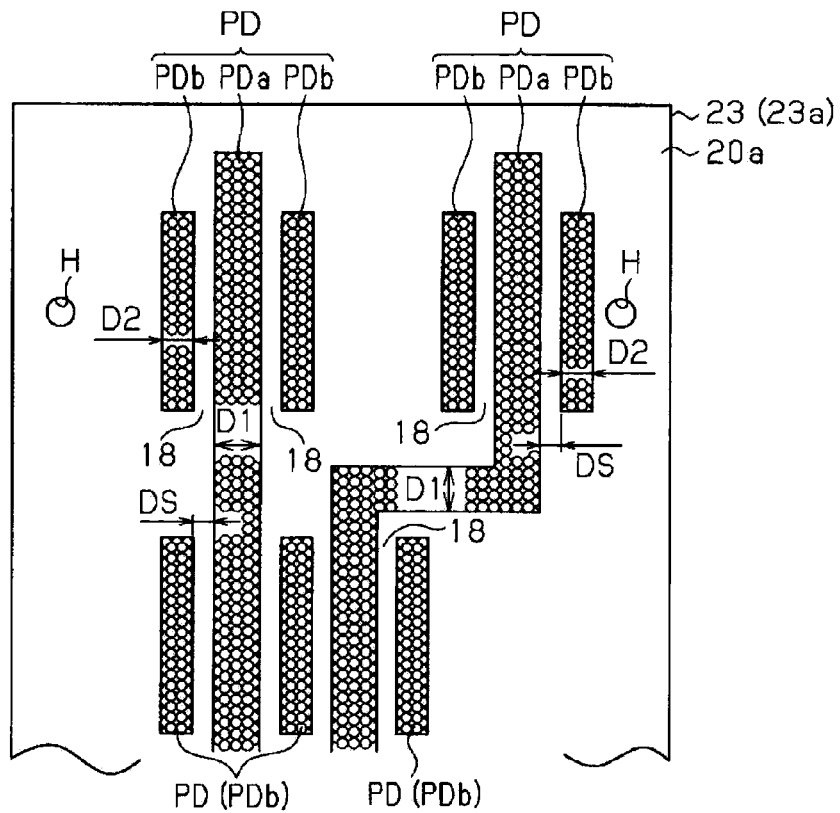
FIGS. 10A and 10B are plan views showing a dry pattern in the method for manufacturing a multilayer ceramic substrate according to the second embodiment.
Figure 10B:
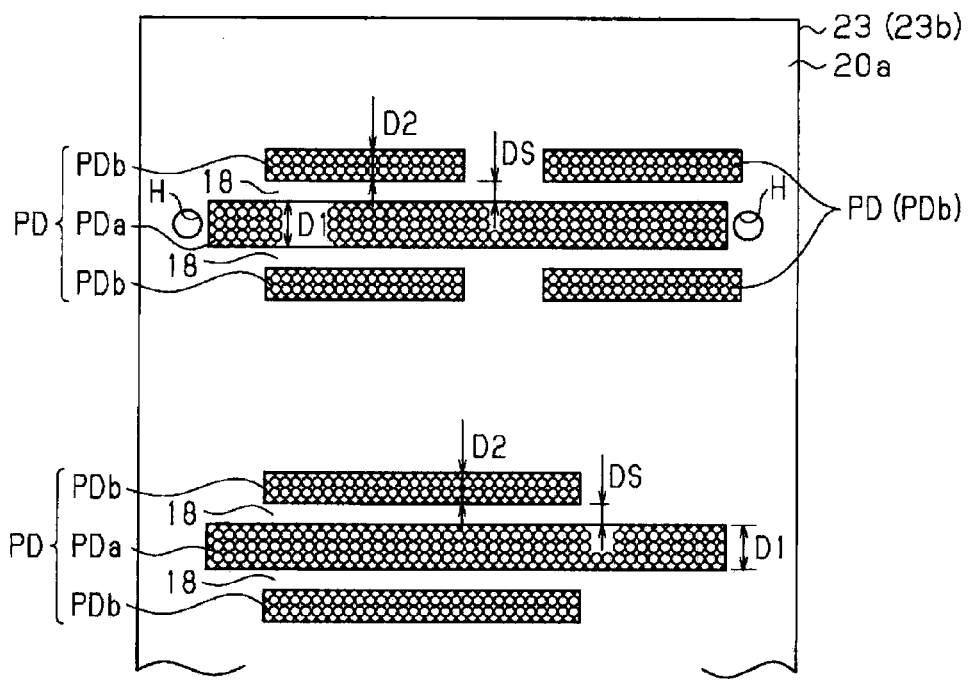

In the drying step, dry patterns PD are formed to have a convex shape on the drawing face 20a. In particular, in the drying step, the wiring liquid pattern PLa is dried so as to form a wiring dry pattern PDa, and the dummy liquid pattern PLb is dried so as to form a dummy dry pattern PDb as shown in FIGS. 10A and 10B, as is the case with the first embodiment. That is, on the drawing face 20a of each of the first sheet 23a and the second sheet 23b, a plurality of wiring dry patterns PDa and a plurality of dummy dry patterns PDb are formed to have a convex shape. Between the wiring dry pattern PDa and the dummy dry patterns PDb that are formed at the both sides of the predetermined portion (overlapping region) of the wiring dry pattern PDa, grooves 18 having the width DS are formed.

<Laminating Step>

Figure 11:
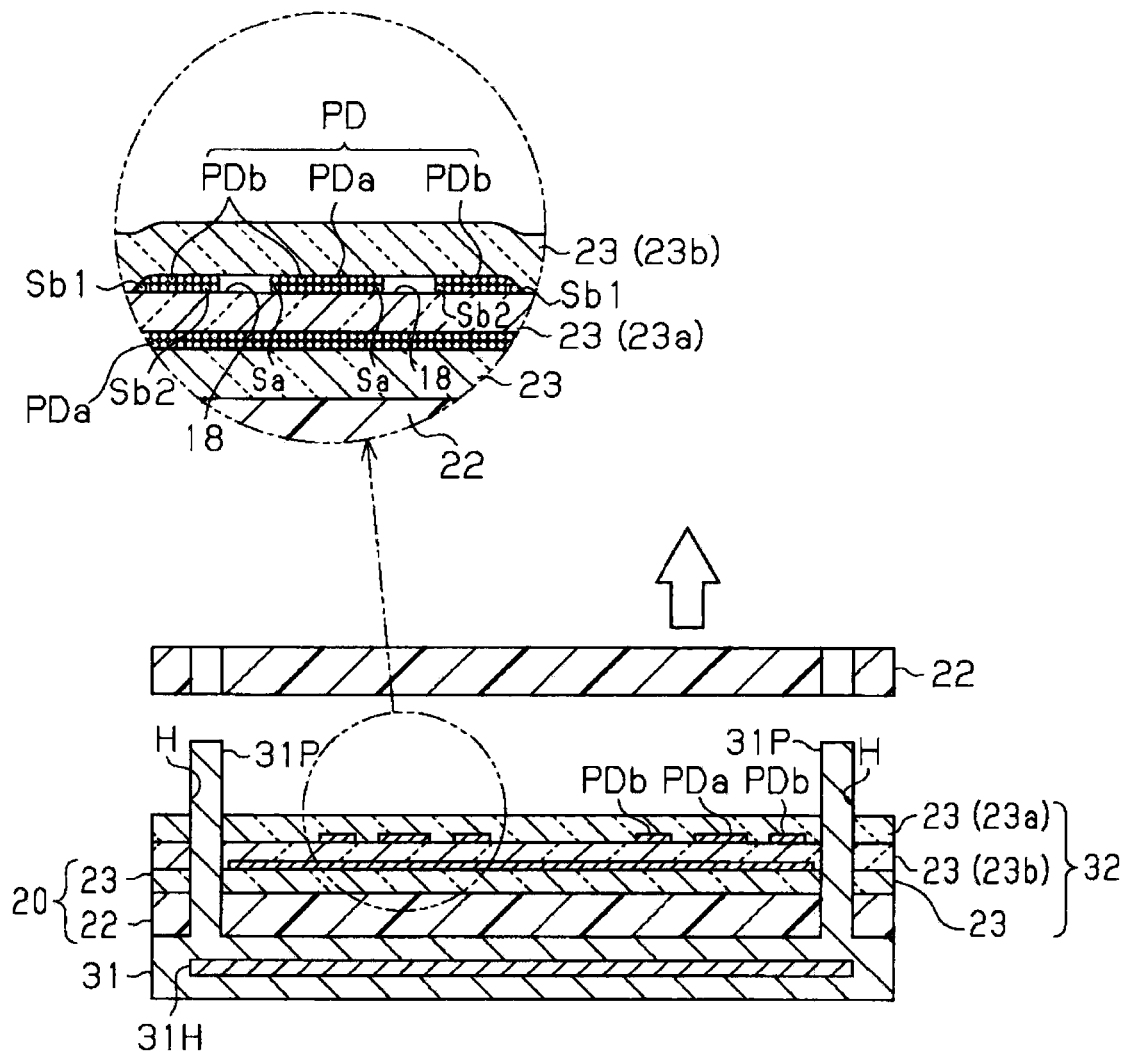
FIG. 11 is a process drawing showing the method for manufacturing a multilayer ceramic substrate according to the second embodiment.

Referring to FIG. 11, a plurality of green sheets 23 are laminated in the laminating step. In particular, as is the case with the first embodiment, after a laminated sheet 20 that is a first layer is positioned on the base plate 31, a laminated sheet 20 that is a second layer is placed on the base plate 31 in a manner allowing its green sheet 23 (the second sheet 23b) to face downside. The positioning pin 31P is inserted into the positioning hole H so as to position the laminated sheet 20 that is the second layer, and a carrier film 22 is peeled off. Thus only the green sheet 23 (the second sheet 23b) of the second layer is laminated on the green sheet 23 of the first layer.

Subsequently, a laminated sheet 20 that is a third layer is placed on the base plate 31 in a manner allowing its green sheet 23 (the first sheet 23a) to face downside. The positioning pin 31P is inserted into the positioning hole H so as to position the laminated sheet 20 that is the third layer, and a carrier film 22 is peeled off. Thus only the green sheet 23 (the first sheet 23a) of the third layer is laminated on the green sheet 23 (the second sheet 23b) of the second layer. Thus, a predetermined number of green sheets 23 are sequentially laminated so as to form a laminated body (hereinafter, referred to as merely a laminated body 32) of the green sheets 23 that has the dry patterns PD.

Figure 12A:
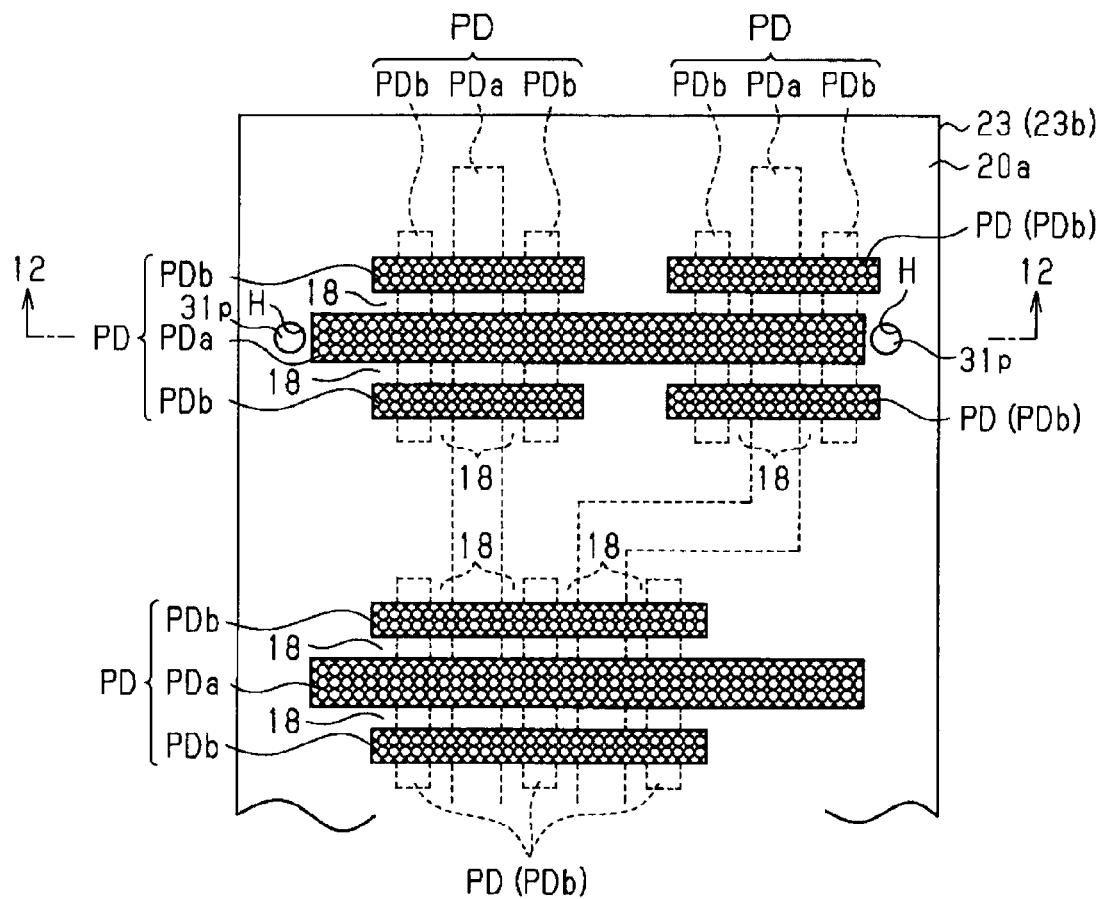
FIGS. 12A and 12B are explanatory diagrams illustrating the method for manufacturing a multilayer ceramic substrate according to the second embodiment.
Figure 12B:
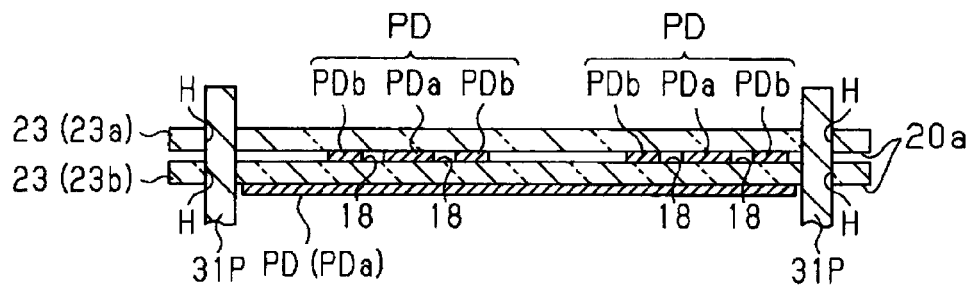

In the laminating step, the drawing face 20a of the first sheet 23a is laminated on a face opposite to the drawing face 20a of the second sheet 23b as shown in FIG. 12B, and the wiring dry pattern PDa of the first sheet 23a and the wiring dry pattern PDa of the second sheet 23b are overlapped in places when viewed from the base plate 31, as shown in FIG. 12A.

The dummy dry patterns PDb having the dummy pattern length DC1 are formed at the both sides of a portion of the wiring dry pattern PDa of the first sheet 23a. The portion of the wiring dry pattern PDa of the first sheet 23a overlaps with the wiring dry pattern PDa of the second sheet 23b. In addition, the dummy dry patterns PDb having the dummy pattern length DC1 or the dummy pattern length DC 2 are formed at the both sides of a portion of the wiring dry pattern PDa of the second sheet 23b. The portion of the wiring dry pattern PDa of the second sheet 23b overlaps with the wiring dry pattern PDa of the first sheet 23b.

Here, the dummy dry pattern PDb of the first sheet 23a is formed to have the dummy pattern length DC1 with which the dummy dry pattern PDb straddles the wiring dry pattern PDa and the dummy dry patterns PDb, disposed at the both sides of the wiring dry pattern PDa, of the second sheet 23b. The dummy dry pattern PDb of the first sheet 23a is overlapped with the wiring dry pattern PDa and the dummy dry patterns PDb of the second sheet 23b in up and down direction. Further, the dummy dry pattern PDa of the second sheet 23b is formed to have the dummy pattern length DC1 or DC2 with which the dummy dry pattern PDb straddles the wiring dry pattern PDa and the dummy dry patterns PDb, which are disposed at the both sides of the wiring dry pattern PDa, of the first sheet 23a. The dummy dry pattern PDb of the second sheet 23b is overlapped with the wiring dry pattern PDa and the dummy dry patterns PDb of the first sheet 23a in up and down direction.

When a green sheet 23 is laminated on another green sheet 23, each of the dry patterns PD (the wiring dry patterns PDa and the dummy dry patterns PDb) between the layers are pressed by the green sheets 23 positioned in up and down direction. At this time, the dry pattern PD composed of the wiring dry pattern PDa and the dummy dry pattern PDb is formed to have a convex shape with respect to the green sheet 23, so that the pattern PD is strongly pressed. In particular, pressing force from up and down direction concentrates on a region in which the dry pattern PD of the first sheet 23a and the dry pattern PD of the second sheet 23b are overlapped with each other in up and down direction depending on the thicknesses of the two dry patterns PD, so that the region is pressed in relative strength.

At this time, as is the case with the first embodiment, since the dummy dry patterns PDb are disposed at the both sides of the wiring dry pattern PDa, the wiring dry pattern PDa and the dummy dry patterns PDb can mutually disperse the pressing force from the green sheets 23 positioned in up and down direction. As a result, the pressing force to the wiring dry pattern PDa is reduced compared to a case where the dummy dry patterns PDb are not provided, so that the wiring dry pattern PDa does not easily deform by the pressing force and further, the dummy dry patterns PDb do not easily deform by the force. Especially, disposing of the dummy dry patterns PDb at the both sides of the wiring dry pattern PDa can effectively decrease the degree of deformation of the wiring dry pattern PDa.

Here, each of the dummy dry patterns PDb deforms its external lateral ends Sb1 as is the case with the first embodiment. On the other hand, the dummy dry patterns PDb are formed at the both sides of the wiring dry pattern PDa with the grooves 18 interposed and therefore the green sheet 23 does not easily bend between the both lateral ends Sa of the wiring dry pattern PDa and internal lateral ends Sb2 of the dummy dry patterns PDb. Thus each of the lateral ends Sa and Sb2 do not easily receive stress caused by the bend of the green sheet 23, becomimg hard to deform.

<Decompress-Packaging Step>

Figure 13:
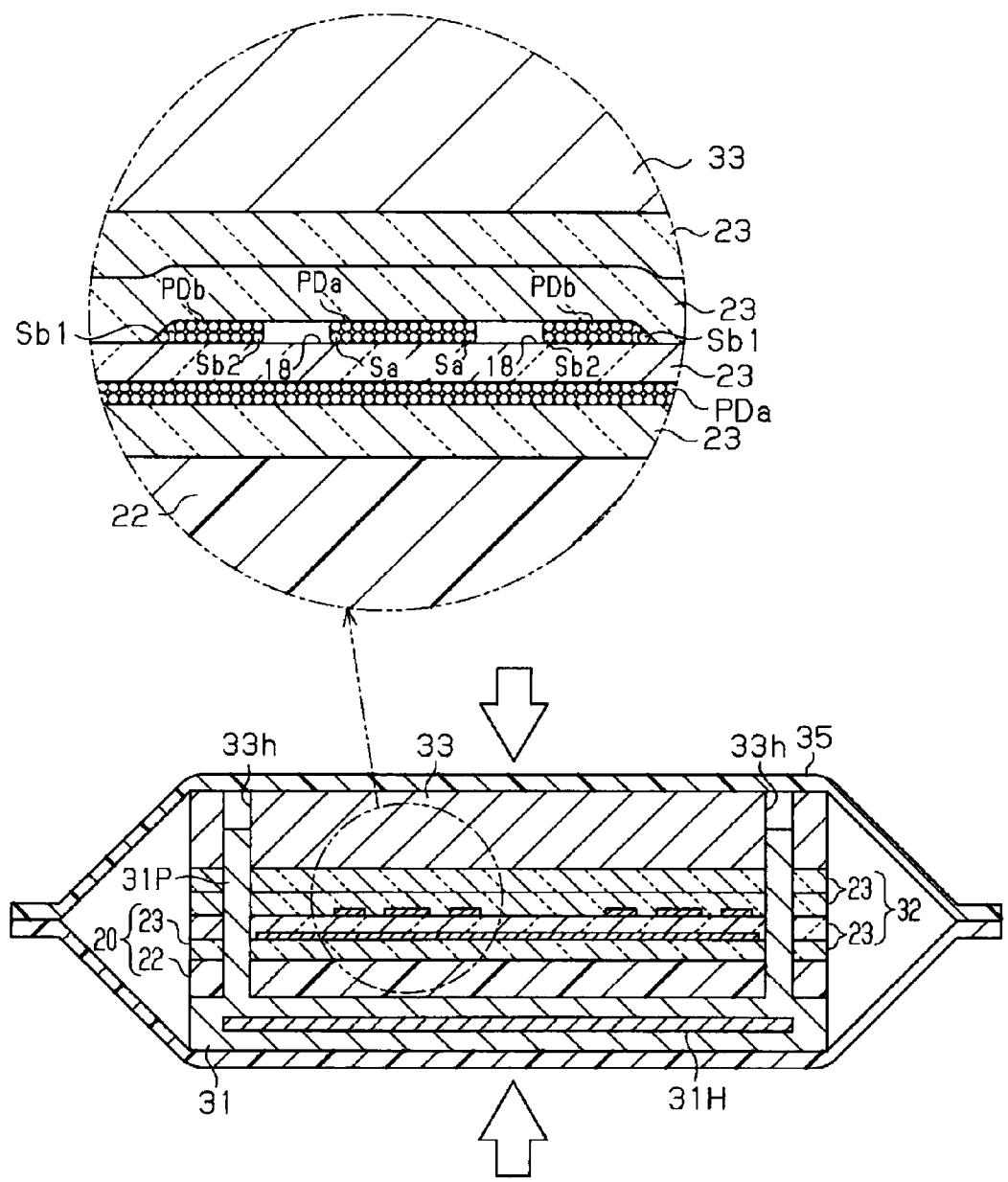
FIG. 13 is a process drawing showing the method for manufacturing a multilayer ceramic substrate according to the second embodiment.
Figure 14A:
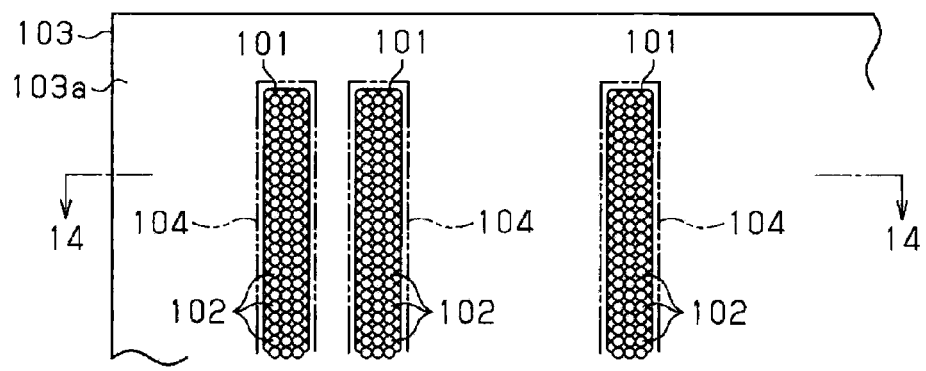
FIGS. 14A and 14B are diagrams showing a related art method for manufacturing a multilayer ceramic substrate.
Figure 14B:
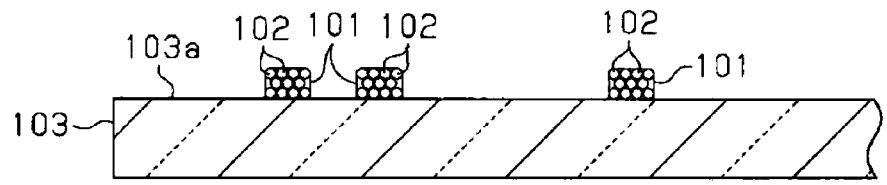
Figure 15A:
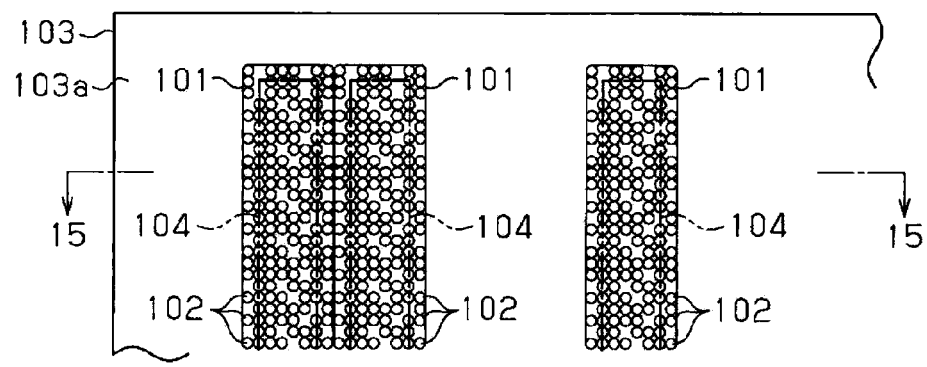
FIGS. 15A and 15B are diagrams showing the related art method for manufacturing a multilayer ceramic substrate.
Figure 15B:
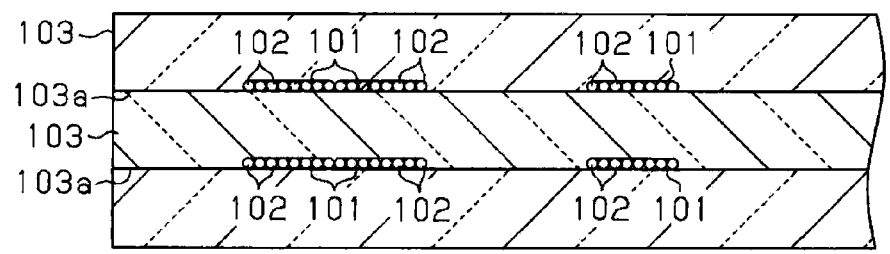
Figure 16A:
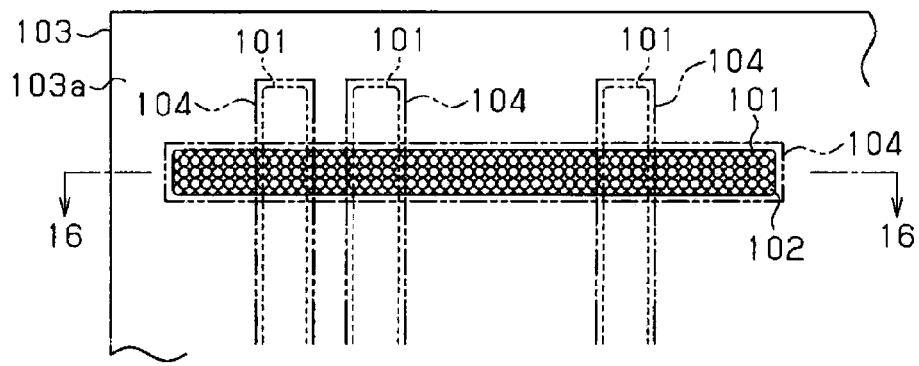
FIGS. 16A and 16B are diagrams showing the related art method for manufacturing a multilayer ceramic substrate.
Figure 16B:
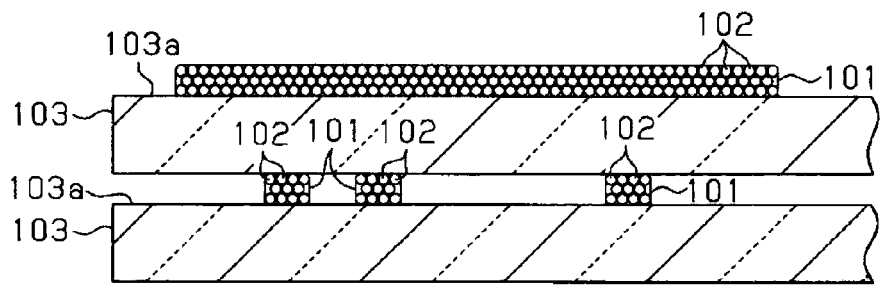
Figure 17A:
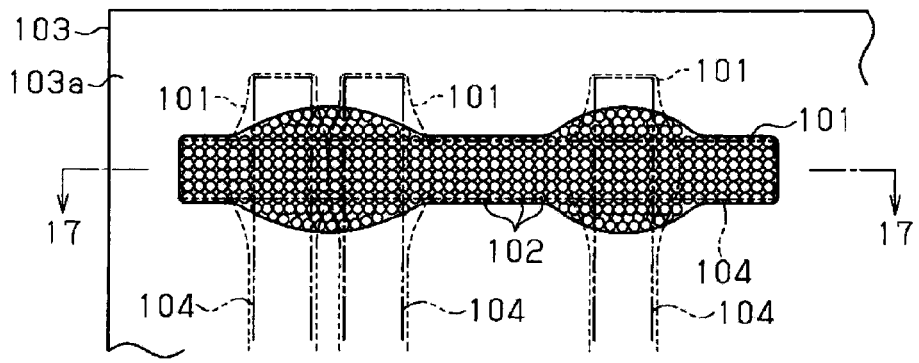
FIGS. 17A and 17B are diagrams showing the related art method for manufacturing a multilayer ceramic substrate.
Figure 17B:
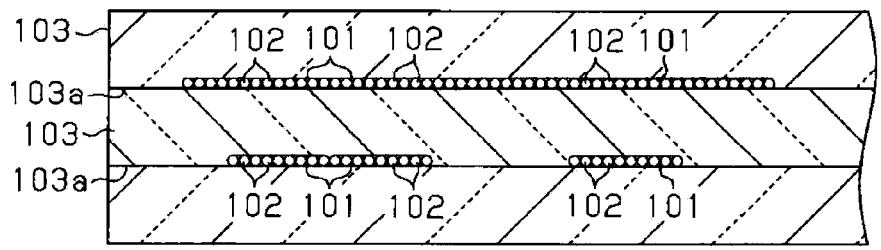

Referring to FIG. 13, in the decompress-packaging step, the laminated body 32 that is vacuum-sealed receives atmospheric pressure through the vacuum packaging bag 35, the base plate 31, and the cover plate 33 so as to be pressed and bonded. At this time, in a region where the dry patterns PD (the wiring dry patterns PDa and the dummy dry patterns PDb) of layers are overlapped with each other, the dry patterns PD are pressed by the green sheets 23 positioned in up and down direction. However, the wiring dry patterns PDa and the dummy dry patterns PDb disperse the pressing force so as to be able to suppress the deformation thereof caused by the pressing force.

<Pressure-Bonding Step>

In the pressure-bonding step, the laminated body 32 after undergoing the decompress-packaging is brought into a hydrostatic pressing device and hydrostatic pressure is applied to the laminated body 32 so as to form a pressure-bonded body. At this time, in a region where the dry patterns PD (the wiring dry pattern PDa and the dummy dry patterns PDb) of layers are overlapped with each other, the dry patterns PD are pressed by the green sheets 23 positioned in up and down direction. However, the wiring dry patterns PDa and the dummy dry patterns PDb disperse the pressing force so as to be able to suppress the deformation thereof.

<Firing Step>

In the firing step, the pressure-bonded body obtained through the pressure-bonding step is taken out of the base plate 31 and brought into a predetermined firing furnace so as to be fired at a firing temperature, as is the case with the first embodiment.

As described above, the second embodiment can provide not only advantageous effects equivalent to or based on the advantageous effects (1) to (5) in the first embodiment but also the following advantageous effects.

(6) In the second sheet 23b of the present embodiment, a wiring dry pattern PDa is formed on a region where the wiring dry pattern PDa of the second sheet 23b is overlapped with the liquid pattern PL drawn on the first sheet 23a, and the dummy dry patterns PDb are formed near the overlapping region. Therefore, when the pressure-bonded body is formed, the pressing force depending on the thickness of the wiring dry pattern PDa formed on the second sheet 23b is applied to the second sheet 23b from the first sheet 23a in the overlapping region. However, the pressing force can be dispersed to the wiring dry pattern PDa and the dummy dry patterns PDb. As a result, the deformation of the wiring dry pattern PDa and the deformation of the dummy dry patterns PDb caused by the pressing force from the first sheet 23a can be reduced in the overlapping region, improving the processing accuracy of the pattern formed on the LTCC substrate 13.

(7) In the first sheet 23a of the present embodiment, the wiring dry pattern PDa is formed on a region where the wiring dry pattern PDa of the first sheet 23a is overlapped with the liquid pattern PL of the second sheet 23b, and the dummy dry patterns PDb are formed near the overlapping region. Therefore, when the pressure-bonded body is formed, the pressing force depending on the thickness of the wiring dry pattern PDa formed on the second sheet 23b is applied to the first sheet 23a from the second sheet 23b in the overlapping region. However, the pressing force can be dispersed to the wiring dry pattern PDa and the dummy dry patterns PDb. As a result, in the overlapping region, the pressing force acting between the first sheet 23a and the second sheet 23b and applied to the wiring dry pattern PDa is dispersed to the dummy dry patterns PDb, so that the deformation of the wiring dry patterns PDa can be reduced and further, the processing accuracy of the pattern formed on the LTCC substrate 13 can be improved.

The above-mentioned embodiments may be altered as follows.

The heater 31H is driven so as to heat the laminated body 32 in the embodiments, but the laminated body 32 does not have to be heated.

In the embodiments, the laminated body 32 sandwiched by the base plate 31 and the cover plate 33 is decompress-packaged. However, the laminated body 32 placed on the base plate 31, that is, the laminated body 32 without the cover plate 33 may be decompress-packaged, or only the laminated body 32 may be decompress-packaged.

The firing step of the embodiments may be conducted such that after the binder is decomposed and scattered under an oxygen atmosphere, the dry pattern PD is fired under a reduction atmosphere of hydrogen so as to reduce the conductive pattern that is oxidized. That is, the present invention is not limited to the temperature, the time, the atmosphere, and the like of the firing step.

The distance between the wiring liquid pattern PLa (the wiring dry pattern PDa) and the dummy liquid pattern PLb (the dummy dry pattern PDb) is set to be the width DS in the embodiments. However, the distance is not limited to the width DS as long as the internal wirings 15 and the dummy lines 17 are not electrically connected with each other on the LTCC substrate 13.

The dummy liquid patterns PLb are drawn at the both sides of the wiring liquid pattern PLa in the embodiments, but the dummy liquid pattern PLb may be drawn at one side of the wiring liquid pattern PLa.

The dummy liquid pattern PLb is drawn on a position apart from the wiring liquid pattern PLa at a distance of the width DS in the embodiments, but another wiring liquid pattern PLa may be drawn on a position apart from the wiring liquid pattern PLa at a distance of the width DS. Accordingly, a dry pattern PD of which a deformation is small with respect to pressing force of the green sheets 23 can be formed only by wiring liquid patterns PLa.

The first sheet 23a and the second sheet 23b are directly laminated in the second embodiment, but another green sheet 23 may be interposed between the first sheet 23a and the second sheet 23b. Such structure can provide the same advantageous effects.

The dummy liquid patterns PLb are formed near the wiring liquid patterns PLa of both of the first sheet 23a and the second sheet 23a in the second embodiment. However, the dummy liquid pattern PLb may be drawn near the wiring liquid pattern PLa of one of the first sheet 23a and the second sheet 23b in a case where another wiring liquid pattern is disposed near the wiring liquid pattern or a case where an efficient leeway in design is provided with respect to deformation of the dry pattern.

What is claimed is:

1. A method for manufacturing a multilayer ceramic substrate, comprising:
    a) discharging a droplet of a conductive ink on a first green sheet and a second green sheet so as to draw liquid patterns made of the conductive ink on the first green sheet and the second green sheet;
    b) drying the liquid patterns so as to form dry patterns;
    c) laminating the first green sheet and the second green sheet including the dry patterns so as to form a laminated body, and applying hydrostatic pressure on the laminated body that is decompress-packaged so as to form a pressure-bonded body; and
    d) firing the pressure-bonded body so as to form the multilayer ceramic substrate,
    wherein in the step a), the liquid patterns drawn on the first green sheet and the second green sheet include wiring liquid patterns and dummy liquid patterns, the dummy liquid patterns being drawn on opposing sides of each wiring liquid pattern, a wiring liquid pattern drawn on the first green sheet being overlapped with a wiring liquid pattern drawn on the second green sheet in a laminating direction, the dummy liquid patterns drawn on the first green sheet being overlapped by the dummy liquid patterns drawn on the second green sheet, an external lateral end of the dry pattern of the dummy liquid pattern being deformed, and the external lateral end being at an opposite side relative to the dry pattern of the wiring liquid pattern.

2. The method for manufacturing a multilayer ceramic substrate according to claim 1, wherein in the step a), the wiring liquid patterns and the dummy liquid patterns are drawn to have a distance less or equal to a predetermined distance therebetween.

3. The method for manufacturing a multilayer ceramic substrate according to claim 1, wherein in the step b), the wiring liquid patterns are dried so as to form wiring dry patterns and the dummy liquid patterns are dried so as to form dummy dry patterns, and the wiring dry patterns and the dummy dry patterns are free from contact with each other in a case where hydrostatic pressure is applied to the laminated body in the step c).

4. The method for manufacturing a multilayer ceramic substrate according to claim 1, wherein in the step a), each of the green sheets is heated so as to draw the dummy liquid patterns.

5. The method of claim 1, wherein the conductive ink forming the liquid patterns is electrically conductive, and the dummy liquid patterns are electrically isolated from the wiring liquid patterns.

6. A method for manufacturing a multilayer ceramic substrate, comprising:
   a) discharging a first electrically conductive ink to a first green sheet to form at least a first wiring line and a pair of first dummy lines, the first dummy lines being formed on opposing sides of the first wiring line;
   b) discharging a second electrically conductive ink to a second green sheet to form at least a second wiring line and a pair of second dummy lines, the second dummy lines being formed on opposing sides of the second wiring line;
   c) drying the first wiring line, the pair of first dummy lines, the second wiring line, and the pair of second dummy lines;
   after the step c), laminating the first green sheet and the second green sheet to form a laminated body;
   d) applying hydrostatic pressure to the laminated body to form a pressure-bonded body;
   e) firing the pressure-bonded body to form the multilayer ceramic substrate,
   wherein the first wiring line, the pair of first dummy lines, the second wiring line, and the pair of second dummy lines are electrically conductive, the pair of first dummy lines are electrically isolated from the first wiring line, the pair of second dummy lines are electrically isolated from the second wiring line, external lateral ends of the dry pattern of the pairs of first and second dummy lines being deformed, and the external lateral ends being at an opposite side relative to the dry pattern of the first and second wiring lines.

7. The method of claim 6, wherein the first wiring line and the pair of first dummy lines are overlapped by the second wiring line and the pair of second dummy lines.

8. The method of claim 7, wherein the first wiring line and the pair of first dummy lines are oriented perpendicular to the second wiring line and the pair of second dummy lines.

* * * * *